(12) United States Patent
Chen et al.

(10) Patent No.: US 10,037,963 B2
(45) Date of Patent: Jul. 31, 2018

(54) PACKAGE STRUCTURE AND METHOD OF FORMING THE SAME

(71) Applicant: Taiwan Semiconductor Manufacturing Company, Ltd., Hsinchu (TW)

(72) Inventors: Jie Chen, New Taipei (TW); Chen-Hua Yu, Hsinchu (TW); Hsien-Wei Chen, Hsinchu (TW); Der-Chyang Yeh, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/449,321

(22) Filed: Mar. 3, 2017

(65) Prior Publication Data

US 2018/0151530 A1    May 31, 2018

Related U.S. Application Data

(60) Provisional application No. 62/427,673, filed on Nov. 29, 2016.

(51) Int. Cl.
    *H01L 21/00*    (2006.01)
    *H01L 23/00*    (2006.01)
    (Continued)

(52) U.S. Cl.
    CPC .............. *H01L 24/24* (2013.01); *H01L 24/02* (2013.01); *H01L 24/13* (2013.01); *H01L 24/14* (2013.01); *H01L 25/105* (2013.01); *H01L 25/16* (2013.01); *H01L 25/50* (2013.01); *H01L 2224/02331* (2013.01); *H01L 2224/02373* (2013.01); *H01L 2224/02377* (2013.01); *H01L 2224/02379* (2013.01); *H01L 2224/02381* (2013.01); *H01L 2224/13024* (2013.01); *H01L 2224/14133* (2013.01); *H01L 2224/24011* (2013.01); *H01L 2224/24105* (2013.01); *H01L 2224/24265* (2013.01); *H01L 2224/73209* (2013.01);
    (Continued)

(58) Field of Classification Search
    CPC ............... H01L 21/568; H01L 23/3135; H01L 23/5389; H01L 24/02; H01L 24/13; H01L 24/14; H01L 24/19; H01L 24/96; H01L 25/0652; H01L 25/16; H01L 25/50
    USPC ...................................... 438/5, 109; 257/401
    See application file for complete search history.

(56) References Cited

U.S. PATENT DOCUMENTS 8,361,842 B2    1/2013  Yu et al.
8,680,647 B2    3/2014  Yu et al.
(Continued)

*Primary Examiner* — Brook Kebede
(74) *Attorney, Agent, or Firm* — Slater Matsil, LLP

(57) ABSTRACT

A package structure and method of forming the same includes: a first package including: a first die; a via adjacent the first die; a molding compound encapsulating the via and at least laterally encapsulating the first die around a perimeter of the first die; and a first redistribution structure extending over the first die and the molding compound; a first integrated passive device (IPD) attached to the first redistribution structure, the first IPD disposed proximate the perimeter of the first die; a second IPD attached to the first redistribution structure, the second IPD disposed distal the perimeter of the first die; and an underfill disposed between the first IPD and the first redistribution structure, the second IPD being free of the underfill.

20 Claims, 15 Drawing Sheets

(51) Int. Cl.
 *H01L 25/10* (2006.01)
 *H01L 25/00* (2006.01)
 *H01L 25/16* (2006.01)

(52) U.S. Cl.
 CPC ............ *H01L 2224/73259* (2013.01); *H01L 2225/1035* (2013.01); *H01L 2225/1058* (2013.01); *H01L 2924/19104* (2013.01); *H01L 2924/19106* (2013.01)

(56) References Cited

U.S. PATENT DOCUMENTS

| | | |
|---|---|---|
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 2011/0291288 A1 | 12/2011 | Wu et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2016/0260684 A1* | 9/2016 | Zhai .................... H01L 25/0652 |
| 2017/0250171 A1* | 8/2017 | Yu .......................... H01L 25/50 |

* cited by examiner

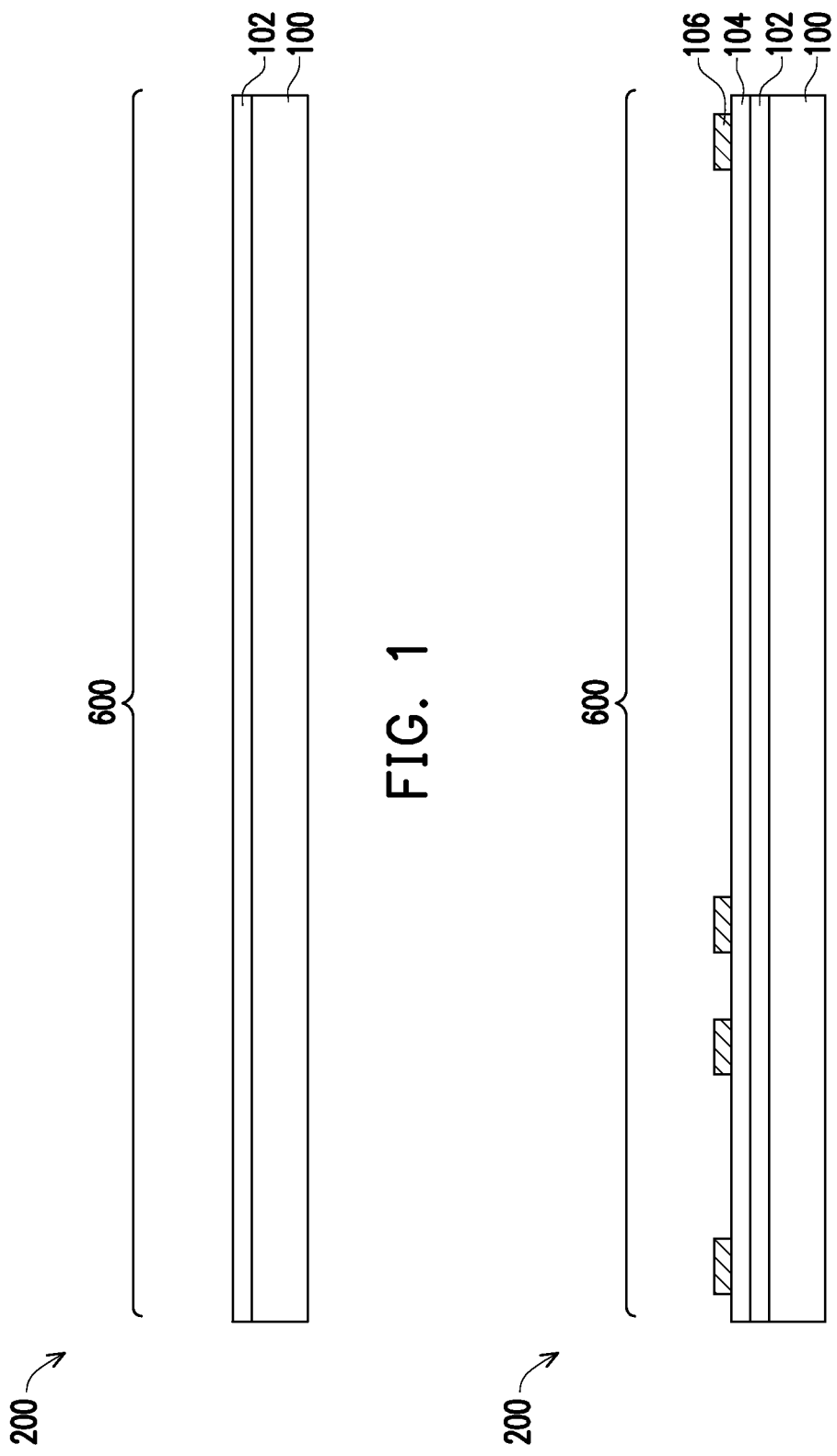

PACKAGE STRUCTURE AND METHOD OF FORMING THE SAME

PRIORITY CLAIM AND CROSS-REFERENCE

This application claims the benefit of U.S. Provisional Application No. 62/427,673, filed on Nov. 29, 2016, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 8A and 9 through 10 are cross-sectional views of intermediate steps during a process for forming a device package, in accordance with some embodiments.

DETAILED DESCRIPTION

Figure 3:
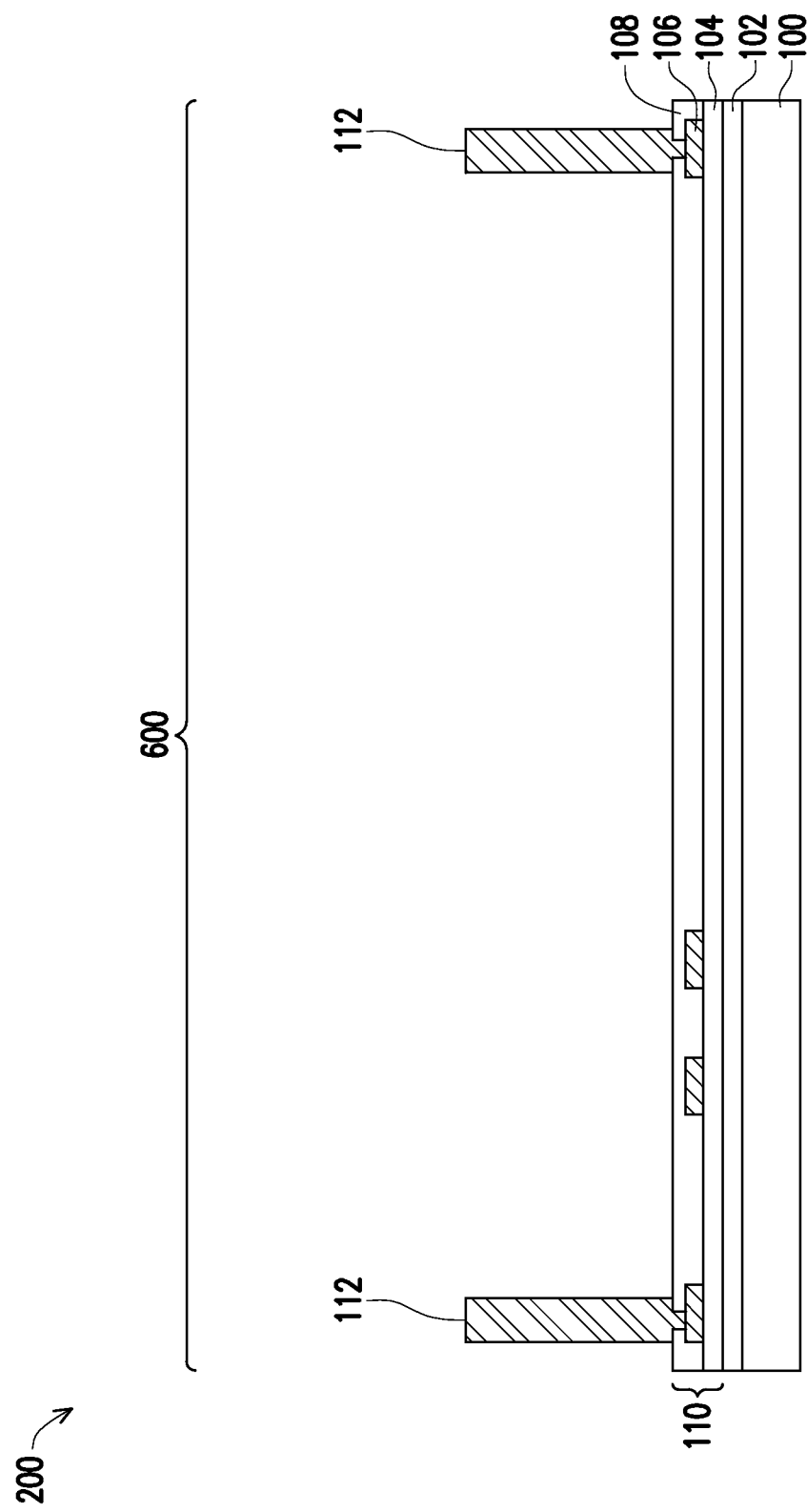

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package structure and method of forming the same are provided in accordance with various embodiments. In particular, a package structure including a die is formed, and integrated passive devices (IPDs) are formed on the package structure. An underfill is formed between a subset of the IPDs and a redistribution structure of the package structure. The underfill is only formed for IPDs located in particular locations on the package structure. For example, the underfill may be formed for IPDs located proximate a perimeter of the die in the package structure. Other IPDs do not have an underfill. Selectively forming an underfill may improve reliability of the final structure while reducing manufacturing costs. Some variations of the embodiments are discussed. One of ordinary skill in the art will readily understand other modifications that may be made that are contemplated within the scope of other embodiments.

FIGS. 1 through 10 are various views of intermediate steps during a process for forming a first device package 200, in accordance with some embodiments. FIGS. 1 through 8A and 9 through 10 are cross-sectional views. FIG. 8B is a planar view, illustrated along reference cross-section A-A from FIG. 8A.

In FIG. 1, the first device package 200 is shown at an intermediate stage of processing including a release layer 102 formed on a carrier substrate 100. A first package region 600 for the formation of the first device package 200 is illustrated. Although only one package region 600 is shown, there may be many package regions formed.

The carrier substrate 100 may be a glass carrier substrate, a ceramic carrier substrate, or the like. The carrier substrate 100 may be a wafer, such that multiple packages can be formed on the carrier substrate 100 simultaneously. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a light-to-heat-conversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the carrier substrate 100, or may be the like. The top surface of the release layer 102 may be leveled and may have a high degree of coplanarity.

In FIG. 2, a dielectric layer 104 and a metallization pattern 106 are formed. As illustrated in FIG. 2, the dielectric layer 104 is formed on the release layer 102. The bottom surface of the dielectric layer 104 may be in contact with the top surface of the release layer 102. In some embodiments, the dielectric layer 104 is formed of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 104 may be formed by any acceptable deposition process, such as spin coating, chemical vapor deposition (CVD), laminating, the like, or a combination thereof.

The metallization pattern 106 is formed on the dielectric layer 104. As an example to form the metallization pattern 106, a seed layer (not shown) is formed over the dielectric layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 106. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 106.

In FIG. 3, a dielectric layer 108 is formed on the metallization pattern 106 and the dielectric layer 104. In some embodiments, the dielectric layer 108 is formed of a polymer, which may be a photo-sensitive material such as PBO, polyimide, BCB, or the like, that may be patterned using a lithography mask. In other embodiments, the dielectric layer 108 is formed of a nitride such as silicon nitride; an oxide such as silicon oxide, PSG, BSG, BPSG; or the like. The dielectric layer 108 may be formed by spin coating, lamination, CVD, the like, or a combination thereof. The dielectric layer 108 is then patterned to form openings to expose portions of the metallization pattern 106. The patterning may be by an acceptable process, such as by exposing the dielectric layer 108 to light when the dielectric layer is a photo-sensitive material or by etching using, for example, an anisotropic etch.

The dielectric layers 104 and 108 and the metallization patterns 106 may be referred to as a back-side redistribution structure 110. As illustrated, the back-side redistribution structure 110 includes the two dielectric layers 104 and 108 and one metallization pattern 106. In other embodiments, the back-side redistribution structure 110 can include any number of dielectric layers, metallization patterns, and vias. One or more additional metallization pattern and dielectric layer may be formed in the back-side redistribution structure 110 by repeating the processes for forming the metallization pattern 106 and the dielectric layer 108. Vias may be formed during the formation of a metallization pattern by forming the seed layer and conductive material of the metallization pattern in the opening of the underlying dielectric layer. The vias may therefore interconnect and electrically couple the various metallization patterns. In some embodiments (shown in FIGS. 13 and 14), the back-side redistribution structure 110 is optional. As such, the metallization patterns 106 and the openings in the dielectric layer 108 may not be formed. In some embodiments, the back-side redistribution structure 110 may only be formed when the metallization patterns 106 have a pattern density above a predefined threshold. In such embodiments, the first device package 200 may be built up from a dielectric layer.

Further in FIG. 3, through vias 112 are formed. As an example to form the through vias 112, a seed layer is formed over the back-side redistribution structure 110, e.g., the dielectric layer 108 and the exposed portions of the metallization pattern 106 as illustrated. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to through vias. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form through vias 112.

Figure 4:
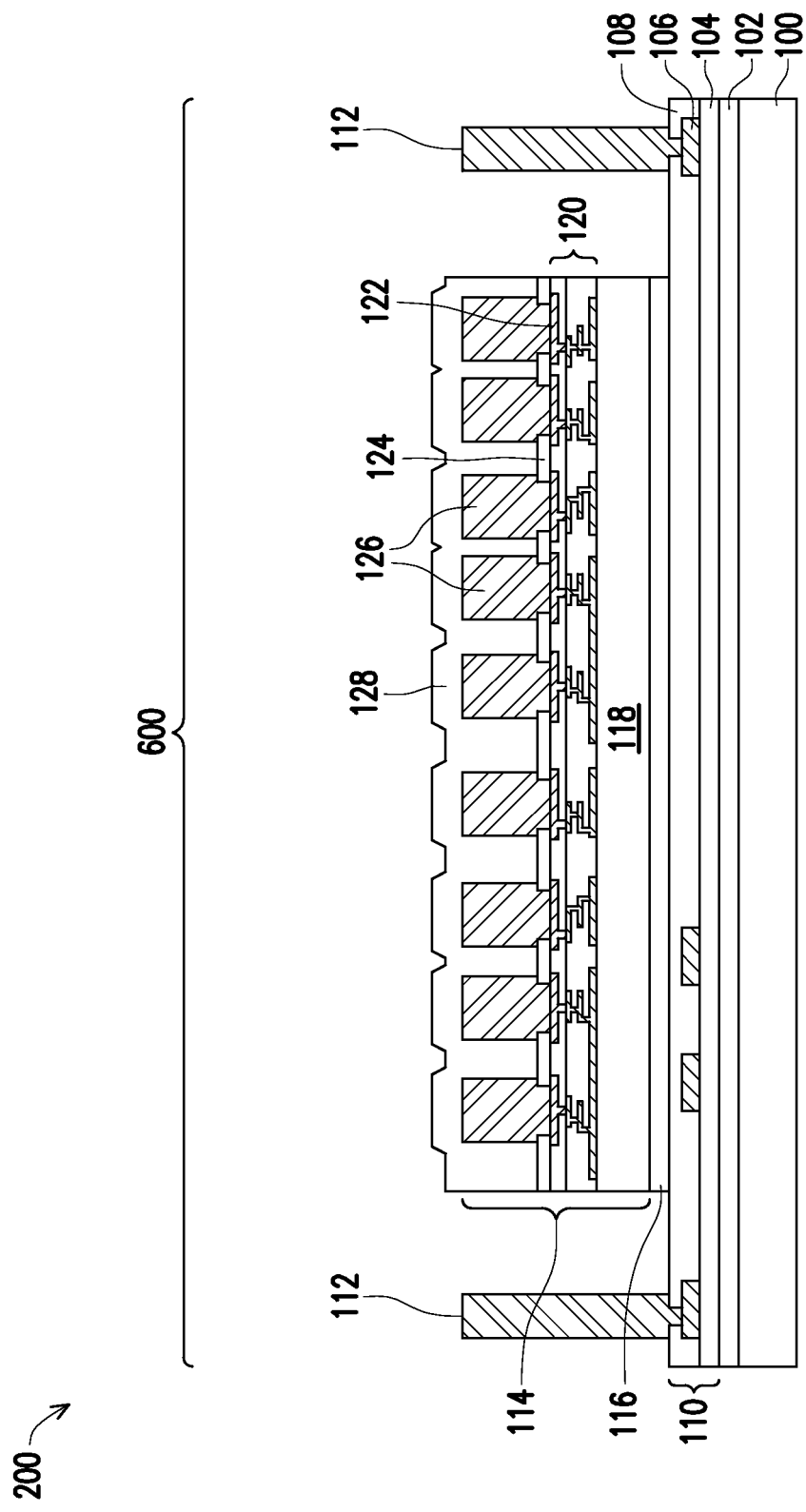

In FIG. 4, integrated circuit dies 114 are adhered to the dielectric layer 108 by an adhesive 116. As illustrated in FIG. 4, one integrated circuit die 114 is adhered in the first package region 600, and in other embodiments (discussed below in FIGS. 11A-11B), more or less integrated circuit dies 114 may be adhered in each region. The integrated circuit dies 114 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 114 may be different sizes (e.g., different heights and/or surface areas), and in other embodiments, the integrated circuit dies 114 may be the same size (e.g., same heights and/or surface areas).

Before being adhered to the dielectric layer 108, the integrated circuit dies 114 may be processed according to applicable manufacturing processes to form integrated circuits in the integrated circuit dies 114. For example, the integrated circuit dies 114 each include a semiconductor substrate 118, such as silicon, doped or undoped, or an active layer of a semiconductor-on-insulator (SOI) substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 118 and may be interconnected by interconnect structures 120 formed by, for example, metallization patterns in one or more dielectric layers on the semiconductor substrate 118 to form an integrated circuit.

The integrated circuit dies 114 further comprise pads 122, such as aluminum pads, to which external connections are made. The pads 122 are on what may be referred to as respective active sides of the integrated circuit dies 114. Passivation films 124 are on the integrated circuit dies 114 and on portions of the pads 122. Openings are through the passivation films 124 to the pads 122. Die connectors 126, such as conductive pillars (for example, comprising a metal such as copper), are in the openings through passivation films 124, and are mechanically and electrically coupled to the respective ones of the pads 122. The die connectors 126 may be formed by, for example, plating, or the like. The die connectors 126 electrically couple the respective integrated circuits of the integrated circuit dies 114.

A dielectric material 128 is on the active sides of the integrated circuit dies 114, such as on the passivation films 124 and the die connectors 126. The dielectric material 128 laterally encapsulates the die connectors 126, and the dielectric material 128 is laterally coterminous with respective ones of the integrated circuit dies 114. The dielectric material 128 may be initially formed to bury or cover the die connectors 126; when the die connectors 126 are buried, the top surface of the dielectric material 128 may have an uneven topology. The dielectric material 128 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

Adhesive 116 is on back-sides of the integrated circuit dies 114 and adheres the integrated circuit dies 114 to the back-side redistribution structure 110, such as the dielectric layer 108 in the illustration. The adhesive 116 may be any suitable adhesive, epoxy, die attach film (DAF), or the like. The adhesive 116 may be applied to a back-side of the integrated circuit dies 114, such as to a back-side of the respective semiconductor wafer or may be applied over the surface of the carrier substrate 100. The integrated circuit dies 114 may be singulated, such as by sawing or dicing, and adhered to the dielectric layer 108 by the adhesive 116 using, for example, a pick-and-place tool.

Figure 5:
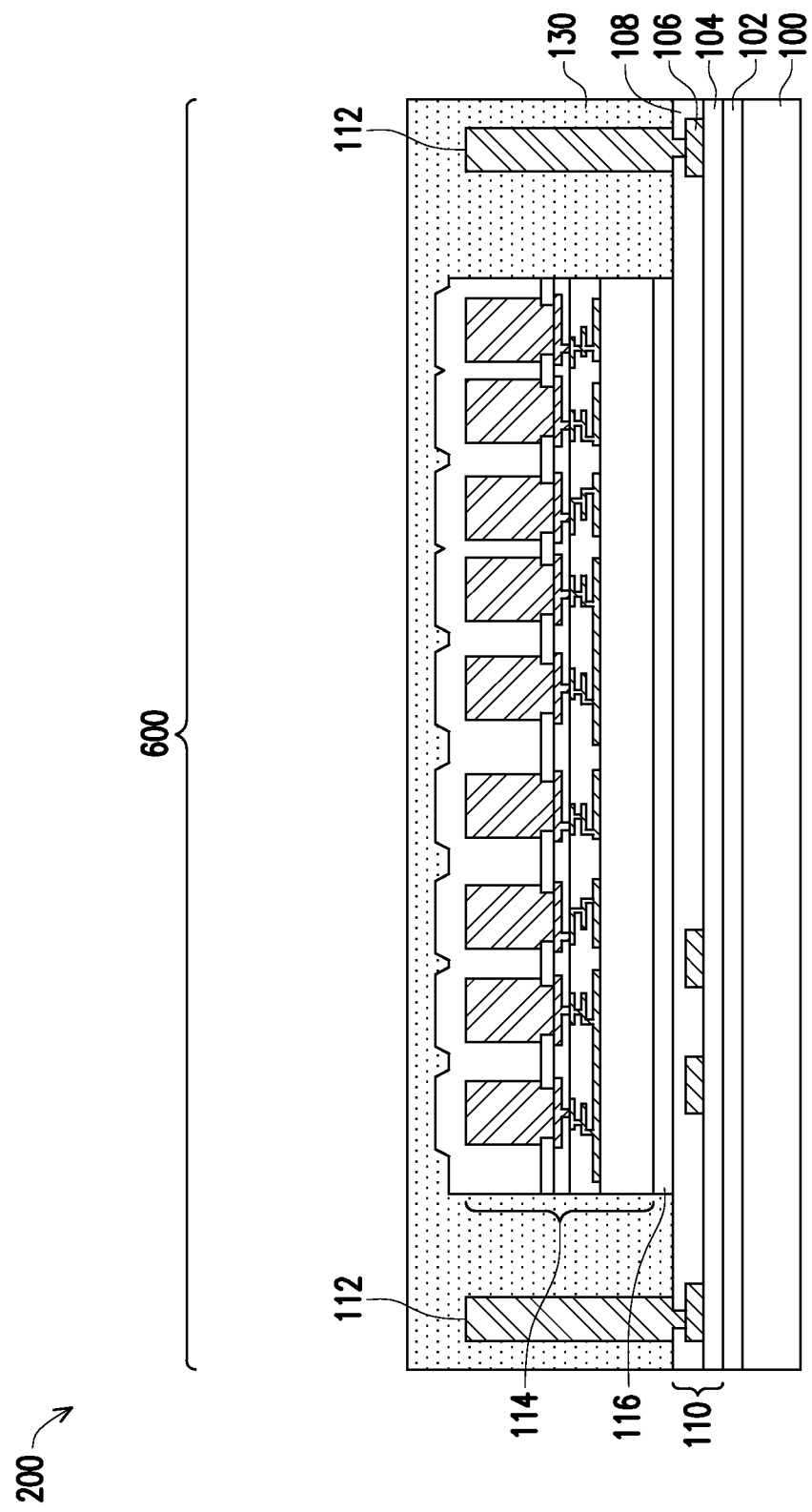

In FIG. 5, an encapsulant 130 is formed on the various components. The encapsulant 130 may be a molding compound, epoxy, or the like, and may be applied by compression molding, transfer molding, or the like. The encapsulant 130 may be formed over the integrated circuit dies 114 such that the die connectors 126 and/or the through vias 112 are buried or covered. After curing, the encapsulant 130 can undergo a grinding process to expose the through vias 112 and die connectors 126. The grinding process may also grind the dielectric material 128. Top surfaces of the through vias 112, die connectors 126, dielectric material 128, and encapsulant 130 are coplanar after the grinding process. The grinding process may be, for example, a chemical-mechanical polish (CMP). In some embodiments, the grinding may be omitted, for example, if through vias 112 and die connectors 126 are already exposed.

Figure 6:
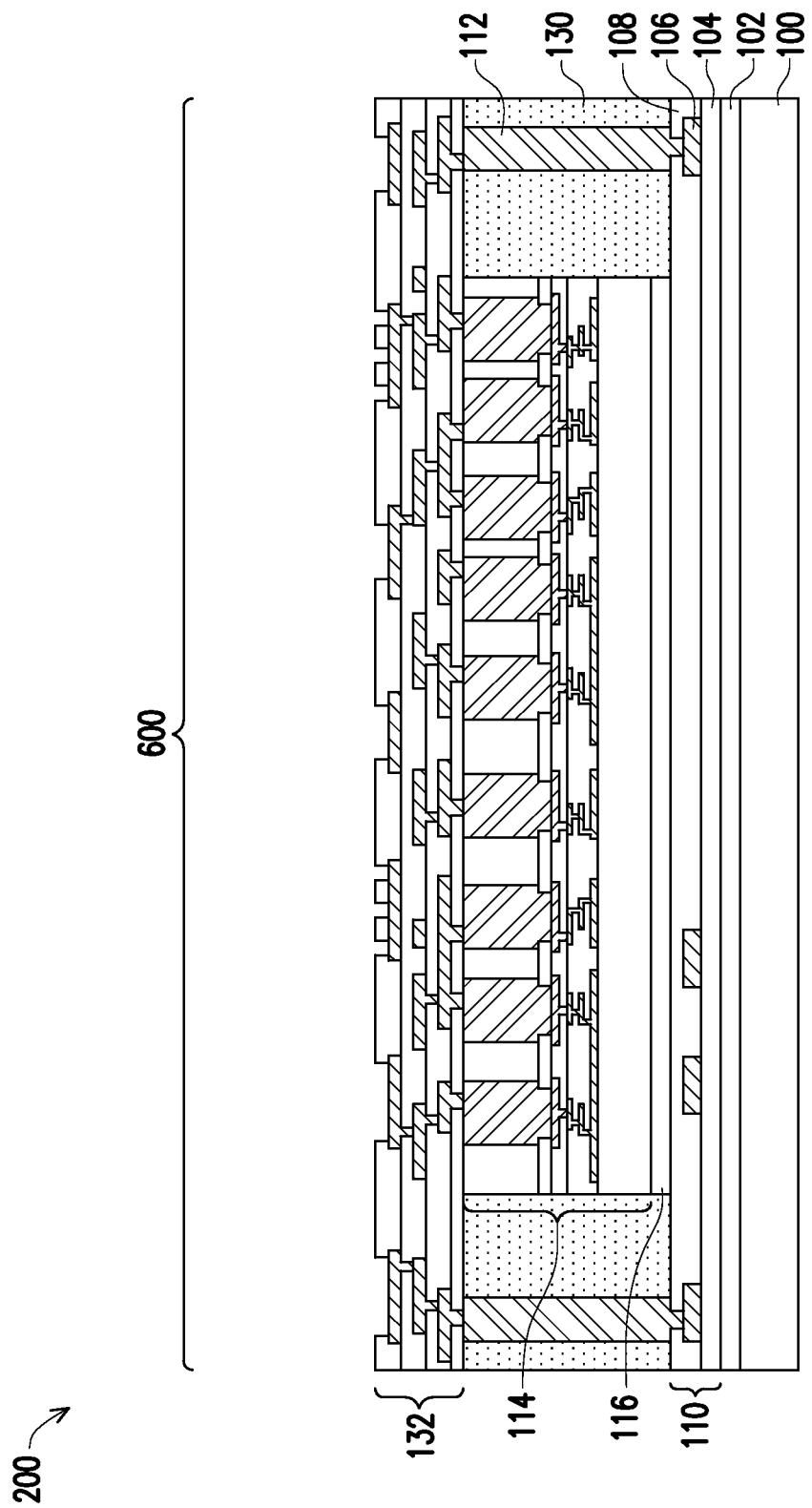

In FIG. 6, a front-side redistribution structure 132 is formed on the encapsulant 130, the through vias 112, and the die connectors 126. The front-side redistribution structure 132 includes multiple dielectric layers and metallization patterns. For example, the front-side redistribution structure 132 may be patterned as a plurality of discrete portions separated from each other by respective dielectric layer(s). The front-side redistribution structure 132 may be, e.g., redistribution layers (RDLs), and may include metal traces (or metal lines) and vias underlying and connected to the metal traces. In accordance with some embodiments of the present disclosure, the RDLs are formed through plating processes, wherein each of the RDLs includes a seed layer (not shown) and a plated metallic material over the seed layer. The seed layer and the plated metallic material may be formed of the same material or different materials.

The front-side redistribution structure 132 is shown as an example. More or fewer dielectric layers and metallization patterns than shown may be formed in the front-side redistribution structure 132. One having ordinary skill in the art will readily understand which steps and processes would be omitted or repeated to form more or fewer dielectric layers and metallization patterns.

Further in FIG. 6, a top dielectric layer of the front-side redistribution structure 132 is patterned. The patterning forms openings to expose portions of the metallization patterns for the subsequent formation of conductive pads. The patterning may be by an acceptable process, such as by exposing the dielectric layer to light when the dielectric layer is a photo-sensitive material or by etching using, for example, an anisotropic etch. If the dielectric layer is a photo-sensitive material, the dielectric layer can be developed after the exposure.

Figure 7:
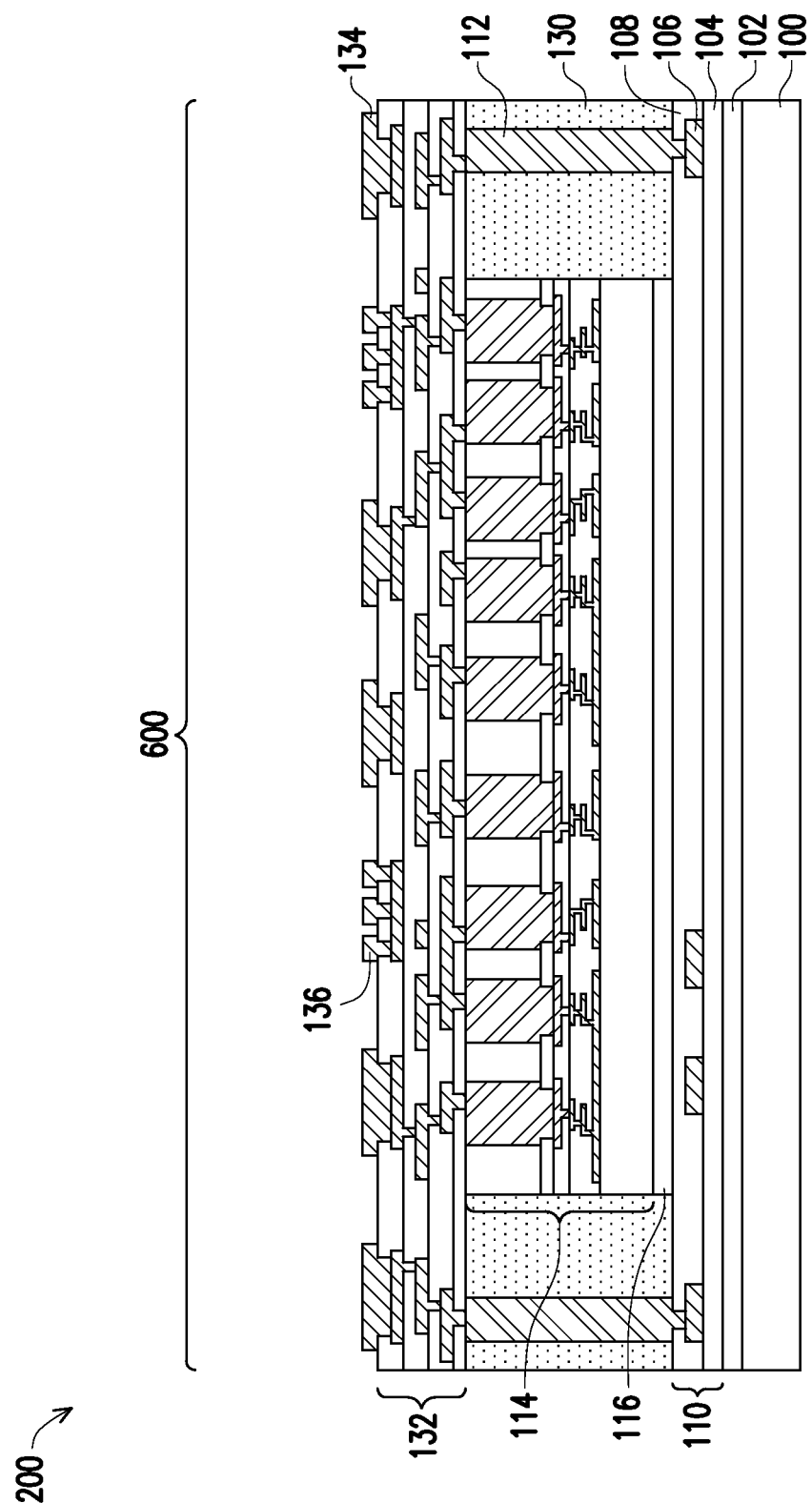

In FIG. 7, pads 134 and 136 are formed on an exterior side of the front-side redistribution structure 132. The pads 134 and 136 are used to couple to conductive connectors. In the illustrated embodiment, the pads 134 and 136 are formed through openings through the dielectric layers to the metallization layers of the front-side redistribution structure 132. As an example to form the pads 134 and 136, a seed layer (not shown) is formed over the dielectric layer. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the conductive pads in the front-side redistribution structure 132. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads 134 and 136. In the embodiment, where the pads 134 and 136 are formed differently, more photo resist and patterning steps may be utilized.

Although they are shown as being different sizes, it should be appreciated that the pads 134 and 136 could be a variety of connection types and sizes. Further, the pads 134 and 136 could be different sizes or the same sizes. For example, in some embodiments, the pads 134 may be under bump metallurgies (UBMs) and the pads 136 may be micro bumps. As such, the pads 134 may be referred to as UBMs 134 and the pads 136 may be referred to as bumps 136 herein. The pads 134 and 136 may be plated in a same plating process (discussed above), or may be formed in different plating processes.

Figure 8A:
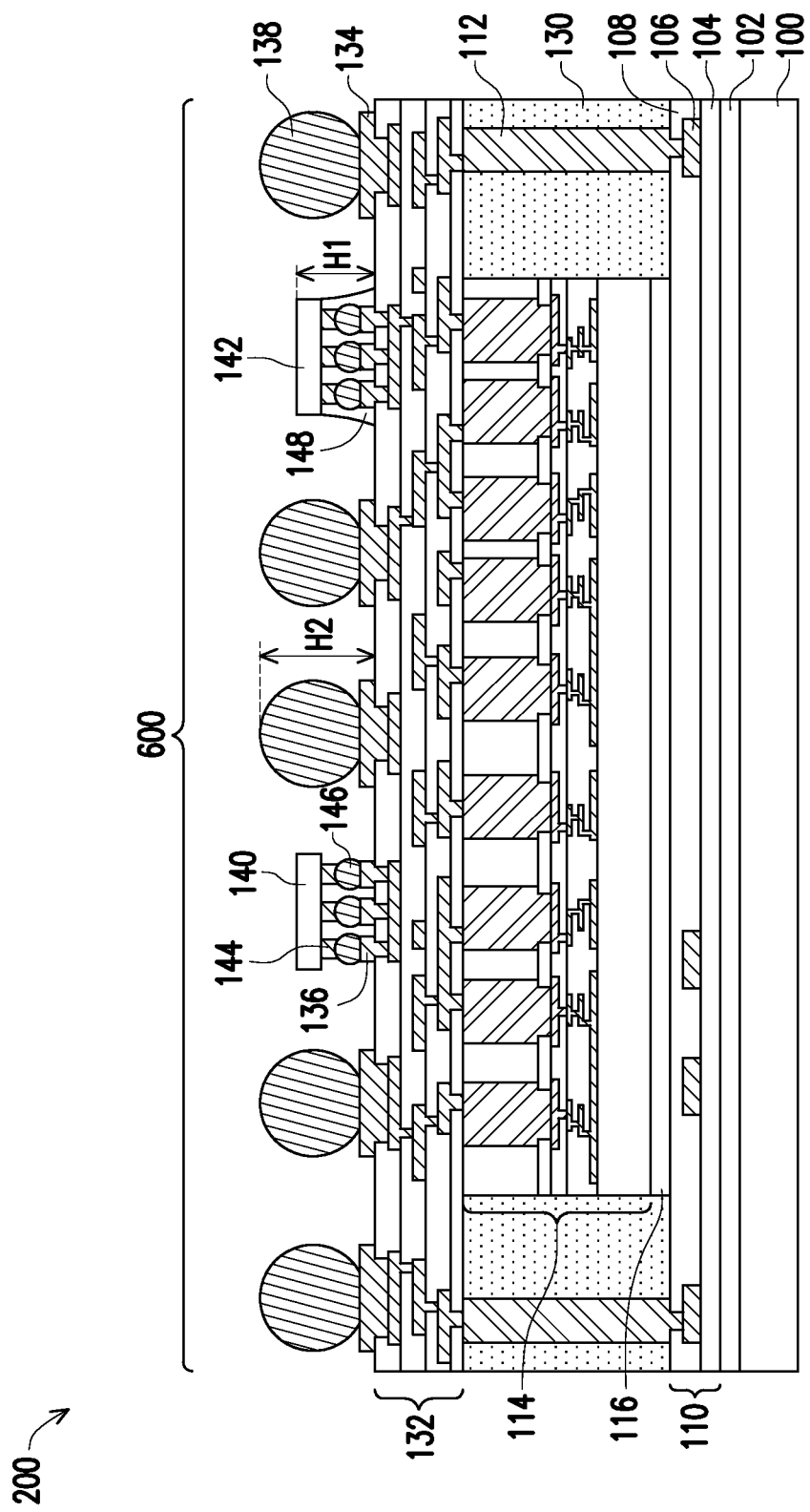
Figure 8B:
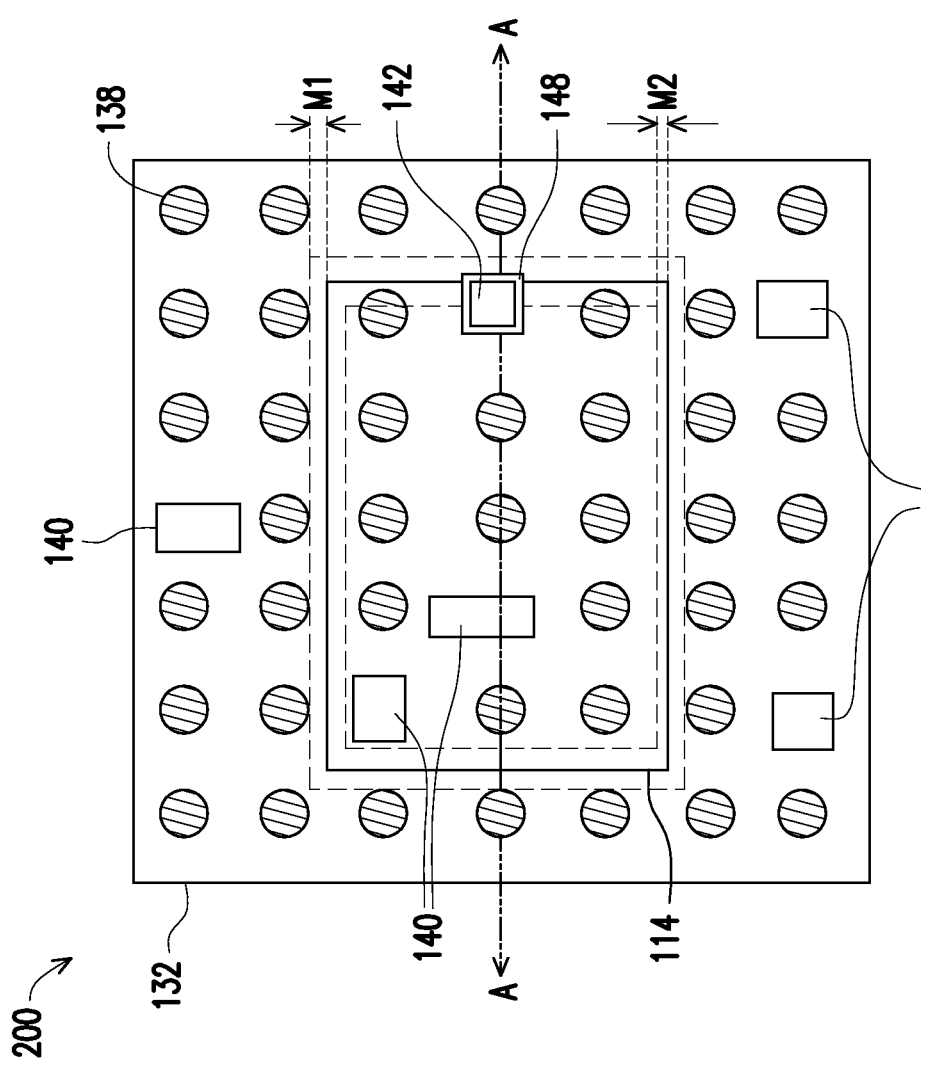
FIG. 8B is a planar view of intermediate steps during a process for forming a device package, in accordance with some embodiments.

In FIGS. 8A and 8B, conductive connectors 138 are formed on the UBMs 134 and IPD components 140 and 142 are mounted on the bumps 136. In some embodiments the conductive connectors 138 may be formed on the UBMs 134 before the IPD components 140 and 142 are mounted on the bumps 136. In some embodiments the conductive connectors 138 may be formed on the UBMs 134 after the IPD components 140 and 142 are mounted on the bumps 136.

The conductive connectors 138 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 138 may include a conductive material such as solder, copper, aluminum, gold, nickel, silver, palladium, tin, the like, or a combination thereof. In some embodiments, the conductive connectors 138 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 138 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 138. The metal cap layer may include nickel, tin, tin-lead, gold, silver, palladium, indium, nickel-palladium-gold, nickel-gold, the like, or a combination thereof and may be formed by a plating process.

Before being bonded to the front-side redistribution structure 132, the IPD components 140 and 142 may be processed according to applicable manufacturing processes to form passive devices in the IPD components 140 and 142. For example, the IPD components 140 and 142 each comprise one or more passive devices in the main structure of the IPD components. The main structure could include a substrate and/or encapsulant. In the embodiments including a substrate, the substrate could be a semiconductor substrate, such as silicon, doped or undoped, or an active layer of a SOI substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The passive devices may include a capacitor, resistor, inductor, the like, or a combination thereof. The passive devices may be formed in and/or on the semiconductor substrate and/or within the encapsulant and may be interconnected by interconnect structures formed by, for example, metallization patterns in one or more dielectric layers on the main structure to form the IPD components 140 and 142. The IPD components 140 and 142 may be the same types of IPD components, or may be different types of IPD components. The IPD components 140 and 142 may be surface mount devices (SMDs), 2-terminal IPDs, multi-terminal IPDs, or other types of passive devices. Micro bumps 144 are formed on and coupled to the IPD components 140 and 142, to which external connections are made.

Solder bumps 146 are formed on ends of the micro bumps 144, forming a solder joint between the micro bumps 144 and the bumps 136, thereby coupling the front-side redistribution structure 132 to the IPD components 140 and 142. In contrast to conventional solder balls such as those used in a ball grid array (BGA) connector (e.g., the conductive connectors 138), which may have a diameter ranging from, e.g., about 150 µm to about 300 µm, micro bumps have much smaller diameters ranging from, e.g., about 10 µm to about 40 µm. The micro bumps may, in some embodiments, have a pitch of about 40 µm or greater.

The IPD components 140 and 142 are attached to particular locations on the first device package 200. As shown in FIG. 8B, the IPD component 142 is located proximate a perimeter of the integrated circuit die 114. In contrast, the IPD components 140 are located distal the perimeter of the integrated circuit die 114.

Further in FIGS. 8A and 8B, an underfill 148 is formed under IPD components proximate the perimeter of the integrated circuit die 114 (e.g., the IPD component 142). FIGS. 8A and 8B illustrate a full-fill underfill scheme, where the underfill 148 completely fills the area between the IPD component 142 and the front-side redistribution structure 132, and surrounds the micro bumps 144, the solder bumps 146, and the bumps 136. In some embodiments (not shown), a partial-fill underfill scheme may be used, where the underfill 148 partially fills the area between the IPD component 142 and the front-side redistribution structure 132. The underfill 148 may be formed by a capillary flow process after the IPD component 142 is attached or may be formed by a suitable deposition or printing method before the IPD component 142 is attached.

Areas of the first device package 200 at the perimeter of the integrated circuit die 114 may be subject to a higher amount of mechanical force or stress. The higher mechanical forces may cause IPD components at the perimeter to fail by, for example, having their contacts (e.g., micro bumps 144) crack. The cracks may be partial or full cracks across the contacts. IPD components may be considered proximate the perimeter of the integrated circuit die 114 if they would be subjected to the higher mechanical forces. Proximity to the perimeter may be evaluated in a plan view. As such, although some components (e.g., the front-side redistribution structure 132) may be located between the IPD components and the integrated circuit die 114 in a cross-sectional view, the IPD component may nonetheless be considered proximate the perimeter of the integrated circuit die 114 if they are proximate the perimeter in a plan view. In other words, proximity to the perimeter is evaluated as if the IPD components were directly above the integrated circuit die 114. In some embodiments, IPD components are considered proximate the perimeter of the integrated circuit die 114 when they intersect the perimeter of the integrated circuit die 114. In some embodiments, IPD components are considered proximate the perimeter of the integrated circuit die 114 when they are within a particular distance of the perimeter of the integrated circuit die 114. For example, as shown in FIG. 8B, there may be an exterior margin M1 or an interior margin M2 for the perimeter of the integrated circuit die 114, such that IPD components are considered proximate the perimeter of the integrated circuit die 114 when they are within the exterior margin M1 or the interior margin M2. The exterior margin M1 and the interior margin M2 may be the same, or may be different. In an embodiment, the exterior margin M1 is about 30 μm, and the interior margin M2 is about 30 μm.

In the example shown in FIGS. 8A and 8B, the IPD component 142 is considered proximate the perimeter of the integrated circuit die 114 because it intersects the perimeter of the integrated circuit die 114. Likewise, the IPD components 140 are considered distal the perimeter of the integrated circuit die 114 because they do not intersect the perimeter of the integrated circuit die 114, and do not fall in the exterior margin M1 or the interior margin M2. As such, the underfill 148 is formed under the IPD component 142, but is not formed under the IPD components 140. Forming the underfill 148 under the IPD component 142 may improve the reliability of the IPD component 142 by protecting it from the mechanical forces exerted by the integrated circuit die 114. Selectively forming the underfill 148 may also reduce package formation costs, as the underfill 148 is not formed under the IPD components 140, which are not under the mechanical forces exerted by the integrated circuit die 114.

After being attached, the IPD component 140 and 142 extend a first height H1 from the front-side redistribution structure 132 that is less than a second height H2 the conductive connectors 138 extend from the front-side redistribution structure 132. As such, there is sufficient standoff height to accommodate the IPD component 140 and 142 when the first device package 200 is mounted on a substrate.

Figure 9:
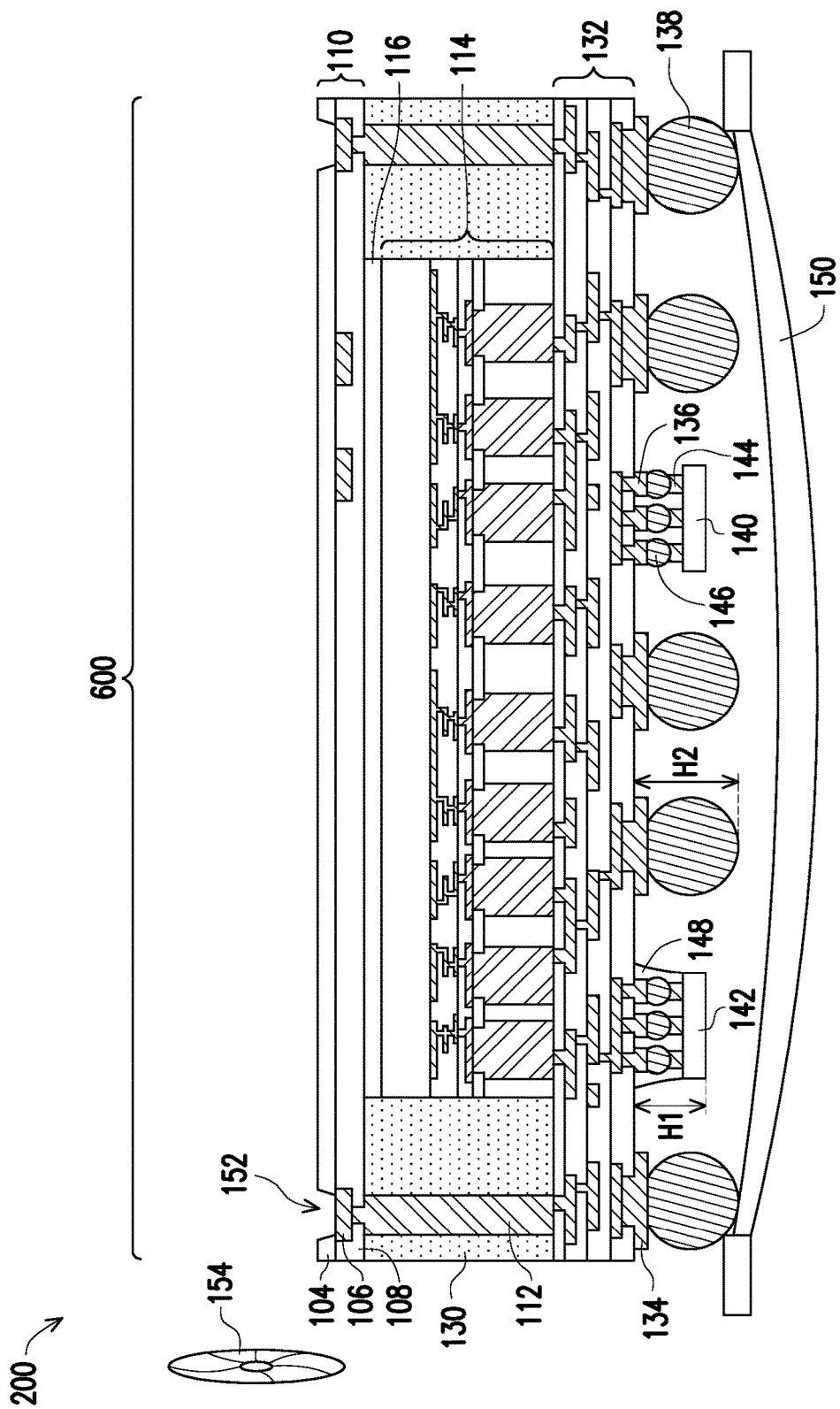

In FIG. 9, a carrier substrate de-bonding is performed to detach (de-bond) the carrier substrate 100 from the backside redistribution structure 110, e.g., the dielectric layer 104. In accordance with some embodiments, the de-bonding includes projecting a light such as a laser light or an UV light on the release layer 102 so that the release layer 102 decomposes under the heat of the light and the carrier substrate 100 can be removed. The structure is then flipped over and placed on a tape 150.

Further in FIG. 9, openings 152 are formed through the dielectric layer 104 to expose portions of the metallization pattern 106. The openings may be formed, for example, using laser drilling, etching, or the like.

Further in FIG. 9, a singulation process is performed by singulating 154 along scribe line regions e.g., between adjacent package regions. In some embodiments, the singulating 154 includes a sawing process, a laser process, or a combination thereof. The singulating 154 singulates the first package region 600 from adjacent package regions (not shown).

Figure 10:
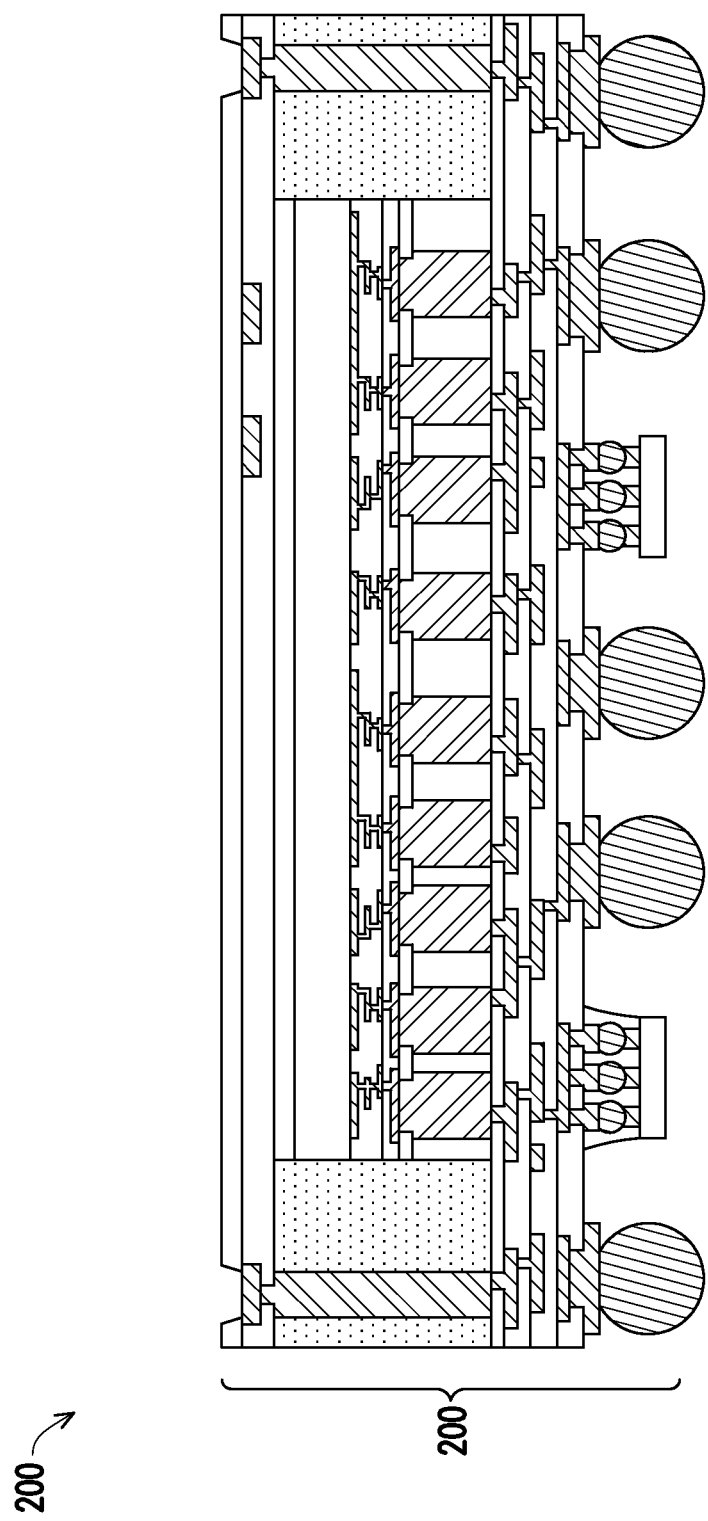

In FIG. 10 the resulting first device package 200 is shown after singulation, which may be from the first package region 600. The first device package 200 may also be referred to as an integrated fan-out (InFO) package 200. In some embodiments, the singulation process is performed after the second device package 300 (discussed below) is bonded to the InFO package 200.

Figure 11:
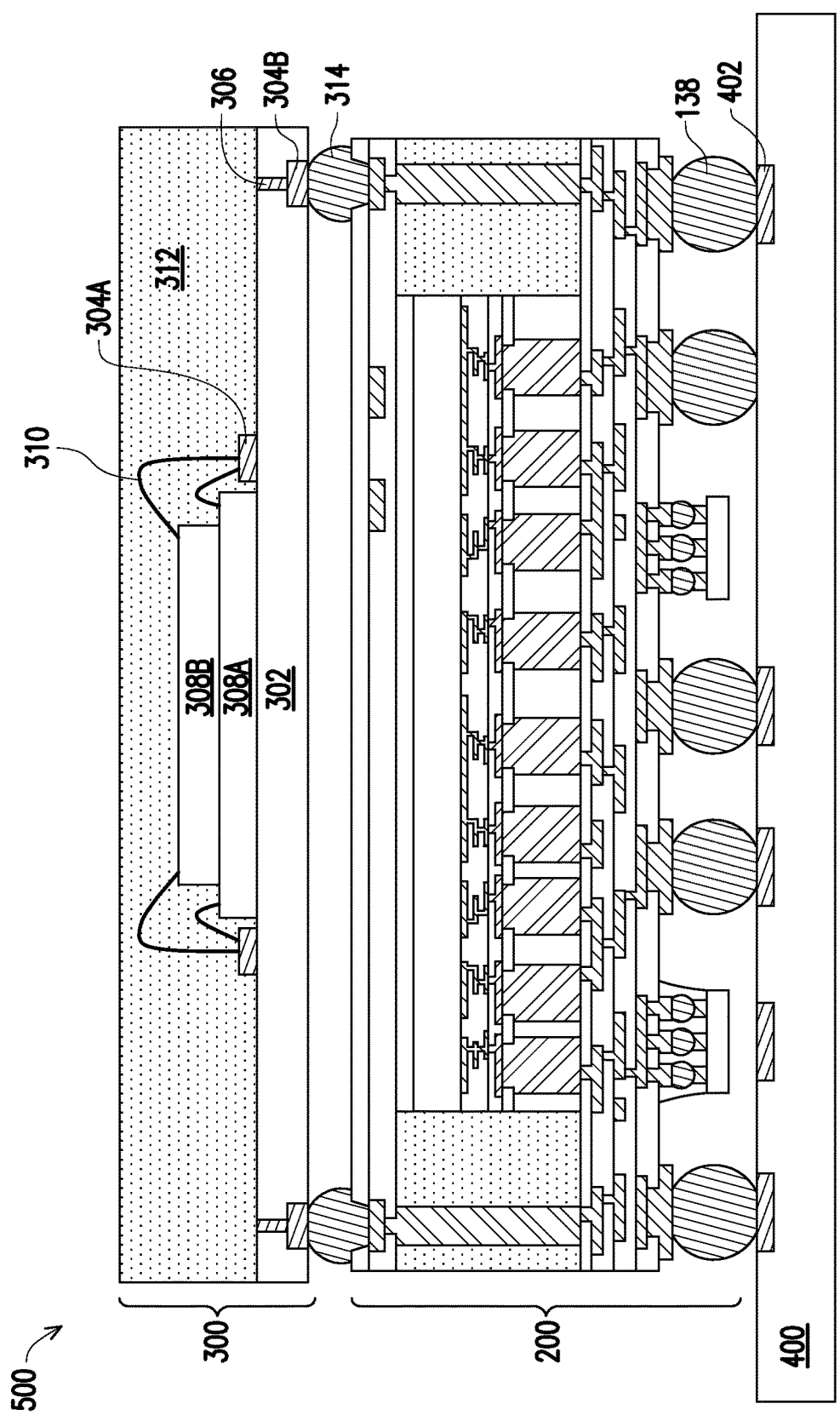
FIG. 11 is a cross-sectional view of intermediate steps during a process for forming a package structure, in accordance with some embodiments.

FIG. 11 is a cross-sectional view of intermediate steps during a process for forming a package structure 500, in accordance with some embodiments. The package structure 500 may be a package-on-package (PoP) structure.

In FIG. 11, a second device package 300 is attached to the first device package 200. The second device package 300 includes a substrate 302 and one or more stacked dies 308 (308A and 308B) coupled to the substrate 302. The substrate 302 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may be a SO) substrate. Generally, an SOI substrate includes a layer of a semiconductor material such as epitaxial silicon, germanium, silicon germanium, SOI, silicon germanium on insulator (SGOI), or combinations thereof. The substrate 302 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 302.

The substrate 302 may include active and passive devices (not shown). As one of ordinary skill in the art will recognize, a wide variety of devices such as transistors, capacitors, resistors, combinations of these, and the like may be used to generate the structural and functional requirements of the design for the second device package 300. The devices may be formed using any suitable methods.

The substrate 302 may also include metallization layers (not shown) and through vias 306. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 302 is substantially free of active and passive devices.

The substrate 302 may have bond pads 304A on a first side of the substrate 302 to couple to the stacked dies 308, and bond pads 304B on a second side of the substrate 302, the second side being opposite the first side of the substrate 302, to couple to the conductive connectors 314. In some embodiments, the bond pads 304A and 304B are formed by forming recesses (not shown) into dielectric layers (not shown) on the first and second sides of the substrate 302. The recesses may be formed to allow the bond pads 304A and 304B to be embedded into the dielectric layers. In other embodiments, the recesses are omitted as the bond pads 304A and 304B may be formed on the dielectric layer. In some embodiments, the bond pads 304A and 304B include a thin seed layer (not shown) made of copper, titanium, nickel, gold, palladium, the like, or a combination thereof. The conductive material of the bond pads 304A and 304B may be deposited over the thin seed layer. The conductive material may be formed by an electro-chemical plating process, an electroless plating process, CVD, ALD, PVD, the like, or a combination thereof. In an embodiment, the conductive material of the bond pads 304A and 304B is copper, tungsten, aluminum, silver, gold, the like, or a combination thereof.

In an embodiment, the bond pads 304A and 304B are UBMs that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 304A and 304B. Any suitable materials or layers of material that may be used for the UBMs 304A and 304B are fully intended to be included within the scope of the current application. In some embodiments, the through vias 306 extend through the substrate 302 and couple at least one bond pad 304A to at least one bond pad 304B.

In the illustrated embodiment, the stacked dies 308 are coupled to the substrate 302 by wire bonds 310, although other connections may be used, such as conductive bumps. In an embodiment, the stacked dies 308 are stacked memory dies. For example, the stacked memory dies 308 may include low-power (LP) double data rate (DDR) memory modules, such as LPDDR1, LPDDR2, LPDDR3, LPDDR4, or the like memory modules.

In some embodiments, the stacked dies 308 and the wire bonds 310 may be encapsulated by a molding material 312. The molding material 312 may be molded on the stacked dies 308 and the wire bonds 310, for example, using compression molding. In some embodiments, the molding material 312 is a molding compound, a polymer, an epoxy, silicon oxide filler material, the like, or a combination thereof. A curing step may be performed to cure the molding material 312, wherein the curing may be a thermal curing, a UV curing, the like, or a combination thereof.

In some embodiments, the stacked dies 308 and the wire bonds 310 are buried in the molding material 312, and after the curing of the molding material 312, a planarization step, such as a grinding, is performed to remove excess portions of the molding material 312 and provide a substantially planar surface for the second device packages 300.

After the second device packages 300 are formed, the second device packages 300 are bonded to the first device packages 200 by way of conductive connectors 314, the bond pads 304B, the back-side redistribution structure 110, and/or the through vias 112. In some embodiments, the stacked memory dies 308 may be coupled to the integrated circuit dies 114 through the wire bonds 310, the bond pads 304A and 304B, through vias 306, the conductive connectors 314, and the through vias 112.

The conductive connectors 314 may be similar to the conductive connectors 138 described above and the description is not repeated herein, although the conductive connectors 138 and 314 need not be the same. In some embodiments, before bonding the conductive connectors 314, the conductive connectors 314 are coated with a flux (not shown), such as a no-clean flux. The conductive connectors 314 may be dipped in the flux or the flux may be jetted onto the conductive connectors 314. In another embodiment, the flux may be applied to the surfaces of the back-side redistribution structure 110.

In some embodiments, the conductive connectors 314 may have an epoxy flux (not shown) formed thereon before they are reflowed with at least some of the epoxy portion of the epoxy flux remaining after the second device package 300 is attached to the first device package 200. This remaining epoxy portion may act as an underfill to reduce stress and protect the joints resulting from the reflowing the conductive connectors 314. In some embodiments, an underfill (not shown) may be formed between the second device package 300 and the first device package 200 and surrounding the conductive connectors 314. The underfill may be formed by a capillary flow process after the second device package 300 is attached or may be formed by a suitable deposition method before the second device package 300 is attached.

The bonding between the second device package 300 and the first device package 200 may be a solder bonding or a direct metal-to-metal (such as a copper-to-copper or tin-to-tin) bonding. In an embodiment, the second device package 300 is bonded to the first device package 200 by a reflow process. During this reflow process, the conductive connectors 314 are in contact with the bond pads 304B and the metallization patterns 106 to physically and electrically couple the second device package 300 to the first device package 200. After the bonding process, an IMC (not shown) may form at the interface of the metallization patterns 106 and the conductive connectors 314 and also at the interface between the conductive connectors 314 and the bond pads 304B (not shown).

Further in FIG. 11, the first device package 200 and the second device package 300 are attached to a substrate 400 by mounting the first device package 200 to the substrate 400. The substrate 400 may be referred to a package substrate 400. The first device package 200 is mounted to the package substrate 400 using the conductive connectors 138.

The package substrate 400 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 400 may be a SOI substrate. Generally, an SOI substrate includes a layer of a semiconductor material such as epitaxial silicon, germanium, silicon germanium, SOI, SGOI, or combinations thereof. The package substrate 400 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 400.

The package substrate 400 may include active and passive devices (not shown). As one of ordinary skill in the art will recognize, a wide variety of devices such as transistors, capacitors, resistors, combinations of these, and the like may be used to generate the structural and functional requirements of the design for the package structure 500. The devices may be formed using any suitable methods.

The package substrate 400 may also include metallization layers and vias (not shown) and bond pads 402 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 400 is substantially free of active and passive devices.

In some embodiments, the conductive connectors 138 can be reflowed to attach the first device package 200 to the bond pads 402. The conductive connectors 138 electrically and/or physically couple the substrate 400, including metallization layers in the substrate 400, to the first device package 200.

The conductive connectors 138 may have an epoxy flux (not shown) formed thereon before they are reflowed with at least some of the epoxy portion of the epoxy flux remaining after the first device package 200 is attached to the substrate 400. This remaining epoxy portion may act as an underfill to reduce stress and protect the joints resulting from the reflowing the conductive connectors 138. In some embodiments, an underfill (not shown) may be formed between the first device package 200 and the substrate 400 and surrounding the conductive connectors 138. The underfill may be formed by a capillary flow process after the first device package 200 is attached or may be formed by a suitable deposition method before the first device package 200 is attached.

Figure 12A:
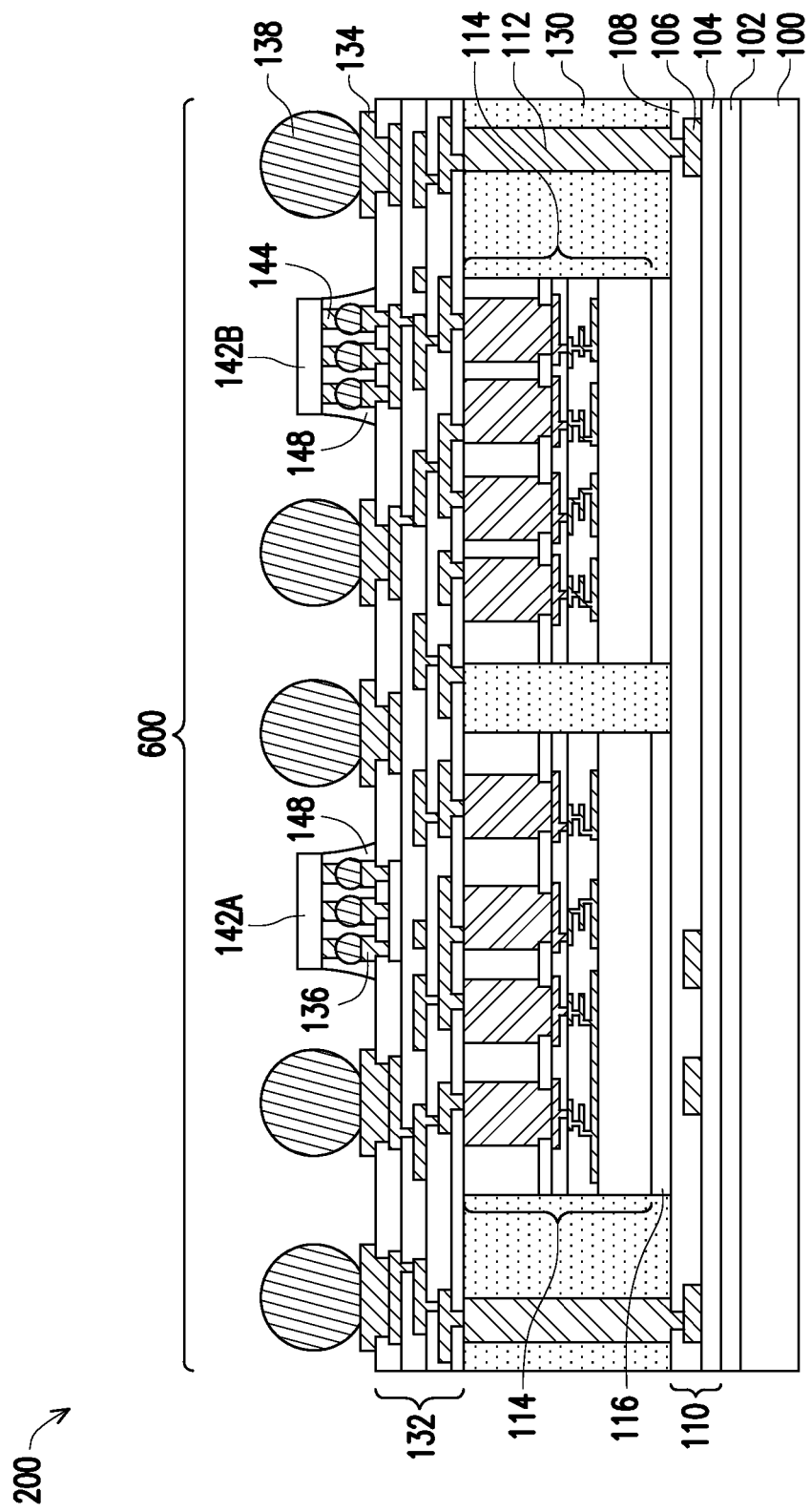
FIG. 12A is a cross-sectional view of intermediate steps during a process for forming a device package, in accordance with some embodiments.
Figure 12B:
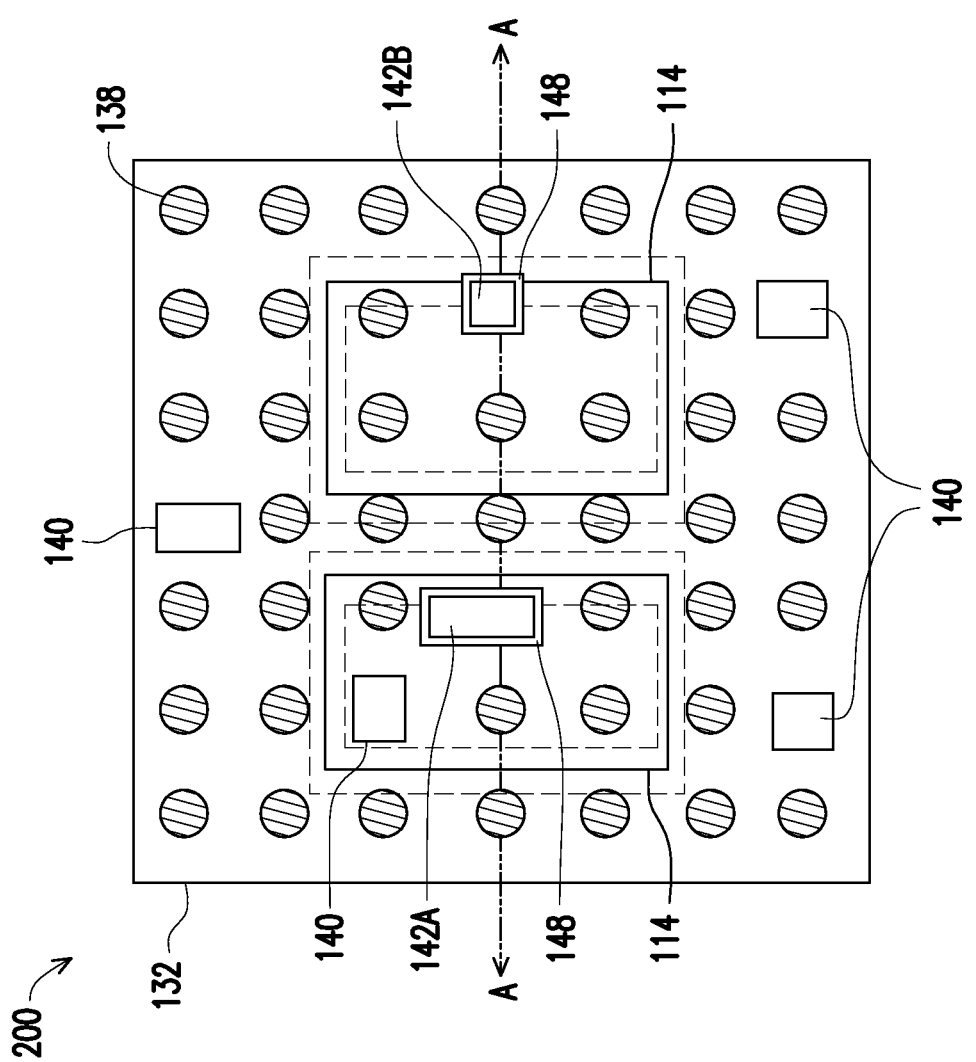
FIG. 12B is a planar view of intermediate steps during a process for forming a device package, in accordance with some embodiments.

FIGS. 12A and 12B are various views of intermediate steps during another process for forming the first device package 200, in accordance with some other embodiments. FIG. 12A is a cross-sectional view. FIG. 12B is a planar view, illustrated along reference cross-section A-A from FIG. 12A.

In FIGS. 12A and 12B, a plurality of integrated circuit dies 114 are adhered in the first package region 600 when forming the first device package 200. As such, the plurality of integrated circuit dies 114 each have a perimeter region where mechanical forces are higher. Each perimeter region has its own interior and exterior margins in the first package region 600.

In the example shown in FIGS. 12A and 12B, there are two IPD components 142A and 142B considered proximate the perimeters of the integrated circuit dies 114, because they each intersect or fall in the margins of the perimeters of the integrated circuit dies 114. As such, the underfill 148 is formed under the IPD component 142A and the IPD component 142B.

Although FIGS. 8A, 8B, 12A, and 12B show examples where there are one or two integrated circuit dies 114, and one or two IPD components 142 with underfill 148, it should be appreciated that embodiment device packages could contain any quantity of integrated circuit dies 114, and any quantity of IPD components could be considered proximate the perimeters of the integrated circuit dies 114.

Figure 13:
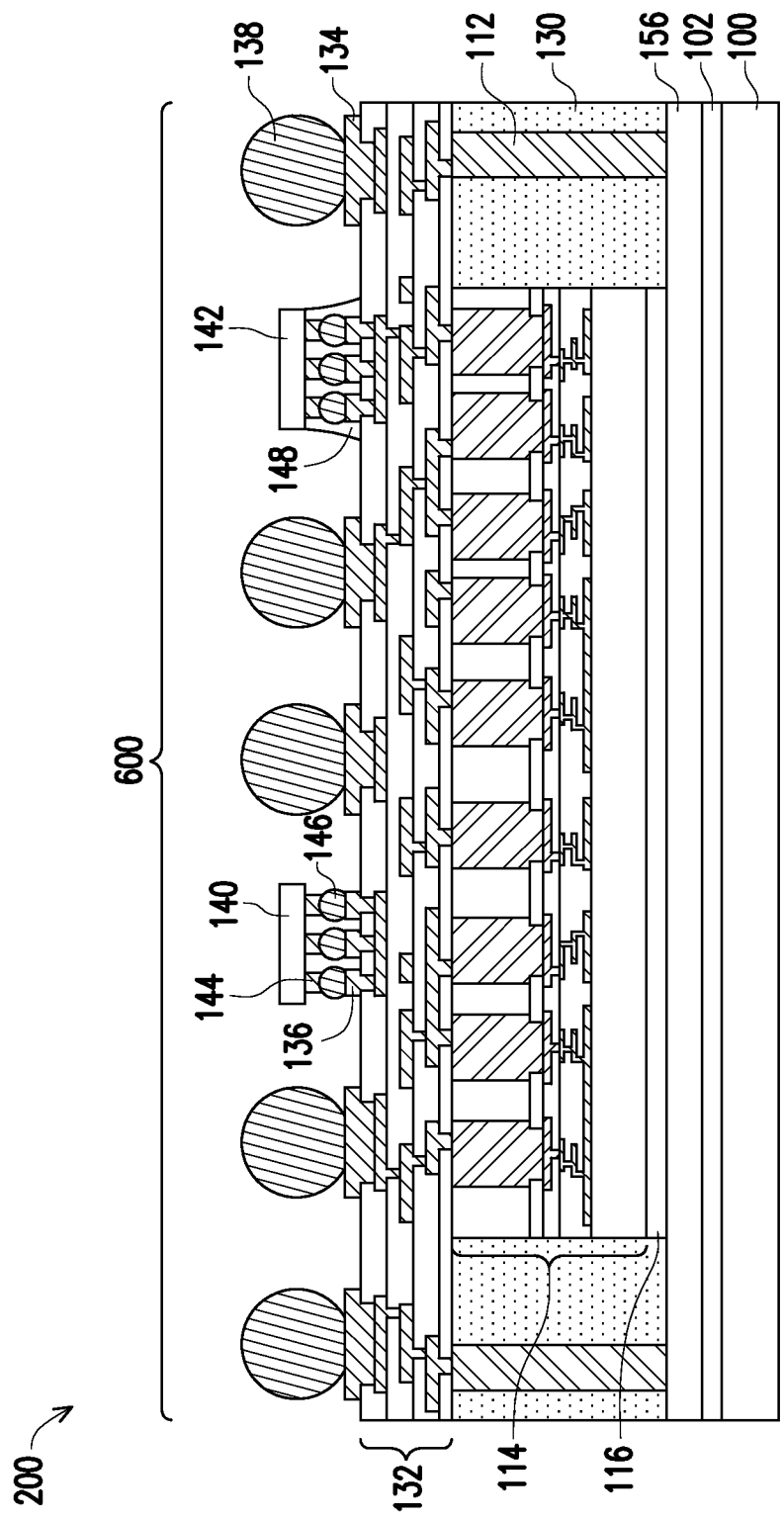
FIGS. 13 through 14 are cross-sectional views of intermediate steps during a process for forming a device package, in accordance with some embodiments.
Figure 14:
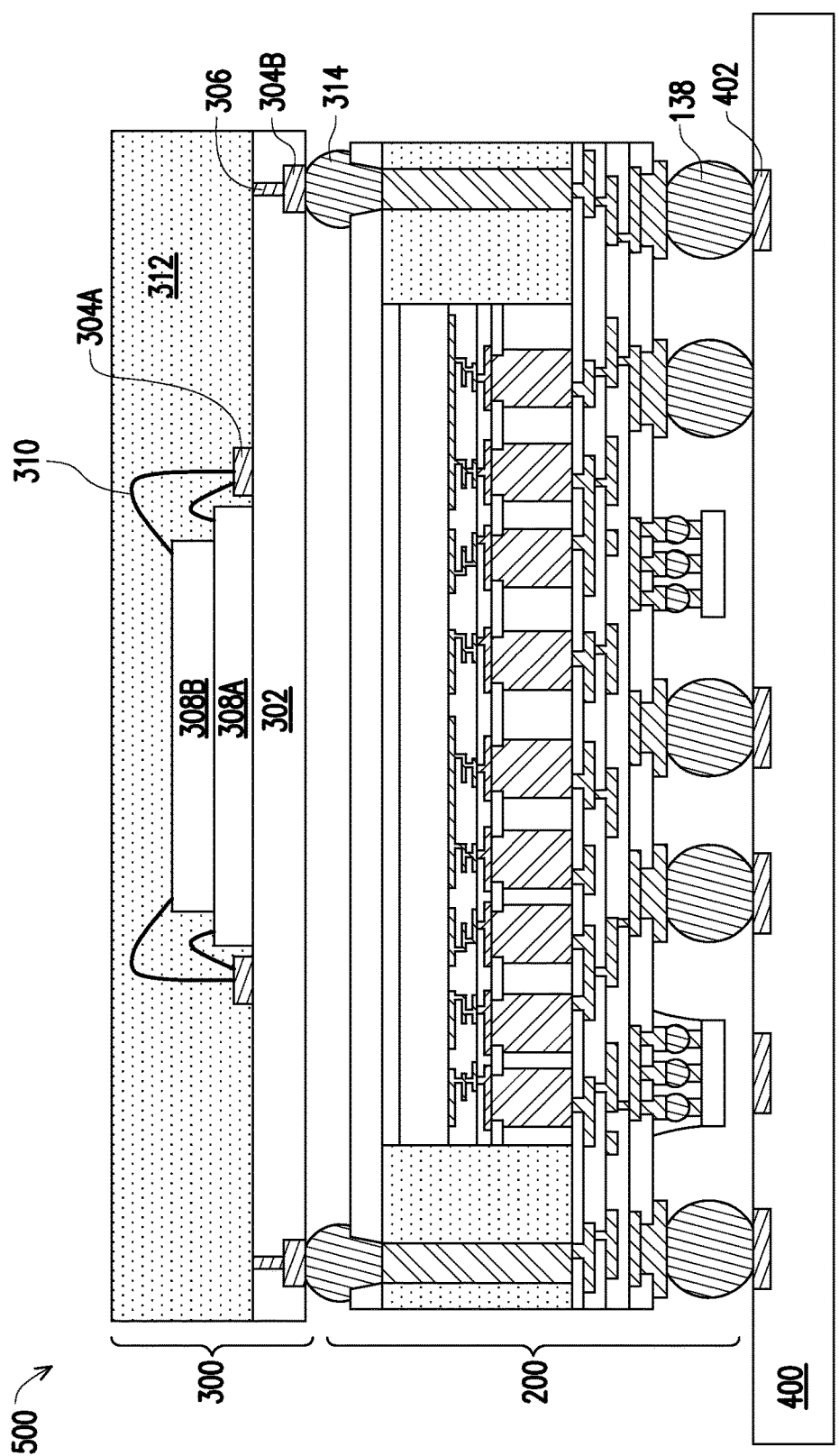

FIGS. 13 and 14 are various views of intermediate steps during another process for forming the first device package 200 and the package structure 500, in accordance with some other embodiments. FIG. 13 is a cross-sectional view of the first device package 200. FIG. 14 is a cross-sectional view of intermediate steps during a process for forming the package structure 500 using the first device package 200 shown in FIG. 13. In FIG. 13, the back-side redistribution structure 110 is not formed on the carrier substrate 100. Instead, a dielectric layer 16 is formed. The remaining steps for forming the first device package 200 are performed. Forming the openings 152 exposes the through vias 112. In FIG. 14, the conductive connectors 314 are physically and electrically coupled to the through vias 112 through the openings 152 in the dielectric layer 156. The back-side redistribution structure 110 may be omitted and the first device package 200 may be formed as shown in FIG. 13 when the pattern densities of the various devices are below a threshold.

Embodiments may achieve advantages. Forming an underfill under IPD components near the perimeter of one or more dies on a package may improve the reliability of the IPD components by protecting them from mechanical forces exerted by the dies. Selectively forming the underfill may also reduce package formation costs, as the underfill is not formed under IPD components that are not exposed to the mechanical forces exerted by the dies.

An embodiment includes a method. The method includes: forming a first package including: forming a via over a first carrier substrate; attaching a first die to the first carrier substrate, the via being adjacent the first die, the first die having a first side and a second side opposite the first side, the first side facing the first carrier substrate; encapsulating the first die and the via with a molding compound; and forming a redistribution structure overlying the second side of the first die and the molding compound; attaching integrated passive devices (IPDs) to the redistribution structure, a first subset of the IPDs proximate a perimeter of the first die, a second subset of the IPDs distal the perimeter of the first die; and forming an underfill between the redistribution structure and each of the first subset of the IPDs, the underfill not formed between the redistribution structure and each of the second subset of the IPDs.

An embodiment includes a method. The method includes: forming a first through via adjacent a first die, the first die having a first side and a second side opposite the first side; encapsulating the first through via and the first die with a molding material; forming a first redistribution structure over the first side of the first die, the first through via, and the molding material, the first redistribution structure having a first side facing the first die and a second side opposite the first side, the first die having a perimeter; forming a first under bump metallization on the second side of the first redistribution structure; attaching integrated passive devices (IPDs) to the second side of the first redistribution structure; and forming an underfill between the second side of the first redistribution structure and each of a subset of the IPDs, the subset of the IPDs proximate the perimeter of the first die.

An embodiment includes a structure. The structure includes: a first die; a via adjacent the first die; a molding compound encapsulating the via and at least laterally encapsulating the first die around a perimeter of the first die; and a first redistribution structure extending over the first die and the molding compound; a first integrated passive device (IPD) attached to the first redistribution structure, the first IPD disposed proximate the perimeter of the first die; a second IPD attached to the first redistribution structure, the second IPD disposed distal the perimeter of the first die; and an underfill disposed between the first IPD and the first redistribution structure, the second IPD being free of the underfill.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first package comprising:
      forming a via over a first carrier substrate;
      attaching a first die to the first carrier substrate, the via being adjacent the first die, the first die having a first side and a second side opposite the first side, the first side facing the first carrier substrate;
      encapsulating the first die and the via with a molding compound; and
      forming a redistribution structure overlying the second side of the first die and the molding compound;
   attaching integrated passive devices (IPDs) to the redistribution structure, a first subset of the IPDs proximate a perimeter of the first die, a second subset of the IPDs distal the perimeter of the first die; and
   forming an underfill between the redistribution structure and each of the first subset of the IPDs, the underfill not formed between the redistribution structure and each of the second subset of the IPDs.

2. The method of claim 1, further comprising:
   debonding the first carrier substrate from the first package; and
   bonding a second package to the first package, the first side of the first die facing the second package.

3. The method of claim 1, wherein the redistribution structure has a first side and a second side opposite the first side, the first side facing the first die, the second side facing the IPDs.

4. The method of claim 3, further comprising:
   bonding the first package to a second carrier substrate, the second side of the redistribution structure facing the second carrier substrate.

5. The method of claim 1, wherein the IPDs comprise first micro bump connections.

6. The method of claim 5, wherein attaching the IPDs to the redistribution structure comprises:
   soldering the first micro bump connections of the IPDs to second micro bump connections of the redistribution structure.

7. The method of claim 5, wherein the underfill contacts the first micro bump connections of the first subset of the IPDs.

8. The method of claim 5, wherein the underfill does not contact the first micro bump connections of the second subset of the IPDs.

9. The method of claim 1, wherein attaching the IPDs to the redistribution structure comprises:
   attaching the first subset of the IPDs to the redistribution structure less than 30 µm from the perimeter of the first die; and
   attaching the second subset of the IPDs to the redistribution structure more than 30 µm from the perimeter of the first die.

10. A method comprising:
    forming a first through via adjacent a first die, the first die having a first side and a second side opposite the first side;
    encapsulating the first through via and the first die with a molding material;
    forming a first redistribution structure over the first side of the first die, the first through via, and the molding material, the first redistribution structure having a first side facing the first die and a second side opposite the first side, the first die having a perimeter;
    forming a first under bump metallization on the second side of the first redistribution structure;
    attaching integrated passive devices (IPDs) to the second side of the first redistribution structure; and
    forming an underfill between the second side of the first redistribution structure and each of a subset of the IPDs, the subset of the IPDs proximate the perimeter of the first die.

11. The method of claim 10, wherein the subset of the IPDs are within 30 µm of the perimeter of the first die.

12. The method of claim 11, wherein the subset of the IPDs are disposed inside the perimeter of the first die.

13. The method of claim 11, wherein the subset of the IPDs are disposed outside the perimeter of the first die.

14. The method of claim 10, wherein remaining IPDs are distal the perimeter of the first die.

15. The method of claim 14, wherein the remaining IPDs are more than 30 µm from the perimeter of the first die.

16. The method of claim 10, wherein the IPDs comprise first micro bump connections, and wherein forming the underfill comprises forming the underfill contacting the first micro bump connections of the subset of the IPDs.

17. A structure comprising:
    a first package comprising:
       a first die;
       a via adjacent the first die;
       a molding compound encapsulating the via and at least laterally encapsulating the first die around a perimeter of the first die; and
       a first redistribution structure extending over the first die and the molding compound;
    a first integrated passive device (IPD) attached to the first redistribution structure, the first IPD disposed proximate the perimeter of the first die;
    a second IPD attached to the first redistribution structure, the second IPD disposed distal the perimeter of the first die; and
    an underfill disposed between the first IPD and the first redistribution structure, the second IPD being free of the underfill.

18. The structure of claim 17, further comprising:
    a first conductive connector coupled to the first redistribution structure and the first IPD, the underfill contacting the first conductive connector; and
    a second conductive connector coupled to the first redistribution structure and the second IPD, the underfill not contacting the second conductive connector.

19. The structure of claim 17, wherein the first IPD is located less than 30 µm from the perimeter of the first die.

20. The structure of claim 17, wherein the second IPD is located more than 30 µm from the perimeter of the first die.

* * * * *